United States Patent
Yang et al.

(10) Patent No.: US 8,929,169 B1
(45) Date of Patent: Jan. 6, 2015

(54) POWER MANAGEMENT FOR NONVOLATILE MEMORY ARRAY

(71) Applicant: SanDisk Technologies Inc., Plano, TX (US)

(72) Inventors: Nian Yang, Mountain View, CA (US); Ting Luo, Sunnyvale, CA (US); Jianmin Huang, San Carlos, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/276,830

(22) Filed: May 13, 2014

(51) Int. Cl.
*G11C 5/14* (2006.01)
*G06F 1/32* (2006.01)

(52) U.S. Cl.
CPC .......... *G11C 5/14* (2013.01); *H01L 2224/49174* (2013.01); *H01L 2225/06503* (2013.01); *G06F 1/3275* (2013.01)
USPC .............................. 365/226; 365/227; 713/320

(58) Field of Classification Search
CPC ............ H01L 2224/49174; H01L 2225/06503
USPC ................................ 365/226, 227; 713/320
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,519,191 B1 | 2/2003 | Morishita | |
| 6,635,970 B2 * | 10/2003 | Lasky et al. .................. | 257/777 |
| 6,842,714 B1 * | 1/2005 | Acar et al. ................... | 702/136 |
| 6,853,559 B2 * | 2/2005 | Panella et al. ................ | 361/764 |
| 7,080,341 B2 * | 7/2006 | Eisenstadt et al. ............. | 326/81 |
| 7,683,491 B2 * | 3/2010 | Itoh et al. ..................... | 257/777 |
| 7,684,833 B2 * | 3/2010 | Marschalkowski et al. .. | 455/574 |
| 7,705,423 B2 * | 4/2010 | Swaminathan et al. ...... | 257/532 |
| 7,957,217 B2 * | 6/2011 | Park et al. ................. | 365/230.03 |
| 8,018,753 B2 * | 9/2011 | Carr et al. ....................... | 365/63 |
| 8,032,804 B2 * | 10/2011 | Jeddeloh ....................... | 714/721 |
| 8,105,940 B2 * | 1/2012 | Christensen et al. .......... | 438/637 |
| 8,228,684 B2 * | 7/2012 | Losavio et al. ................ | 361/803 |
| 8,237,228 B2 * | 8/2012 | Or-Bach et al. .............. | 257/369 |
| 8,253,227 B2 * | 8/2012 | Osada et al. .................. | 257/685 |
| 8,386,690 B2 * | 2/2013 | Li et al. ........................ | 710/316 |

(Continued)

OTHER PUBLICATIONS

Technical Search Report dated Feb. 25, 2013, 7 pages.

(Continued)

*Primary Examiner* — Viet Q Nguyen
(74) *Attorney, Agent, or Firm* — Davis Wright Tremaine LLP

(57) ABSTRACT

In a nonvolatile memory array, power is provided to groups of memory dies by power management circuits that have different power modes. While one power management circuit is in a high-power mode supplying power for power-hungry memory operations, another power management circuit is in a low-power mode so that overall power usage is balanced.

19 Claims, 10 Drawing Sheets

(56) References Cited

U.S. PATENT DOCUMENTS

| | | | |
|---|---|---|---|
| 8,497,732 B2* | 7/2013 | Yasuda et al. | 327/565 |
| 8,565,027 B2* | 10/2013 | Kim et al. | 365/189.07 |
| 8,587,357 B2* | 11/2013 | Kim et al. | 327/296 |
| 8,667,312 B2* | 3/2014 | Rajan et al. | 713/320 |
| 8,687,443 B2* | 4/2014 | Shin et al. | 365/200 |
| 8,799,710 B2* | 8/2014 | Buyuktosunoglu et al. | 714/19 |
| 2008/0056048 A1 | 3/2008 | Seo et al. | |
| 2010/0257379 A1 | 10/2010 | Wang et al. | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

\* cited by examiner

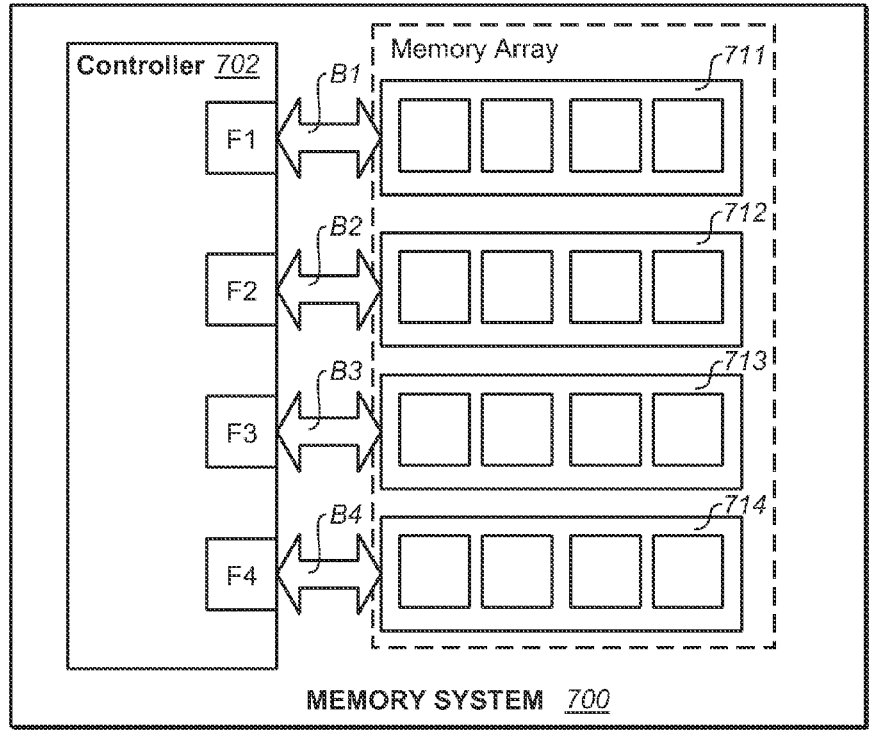
FIG. 7
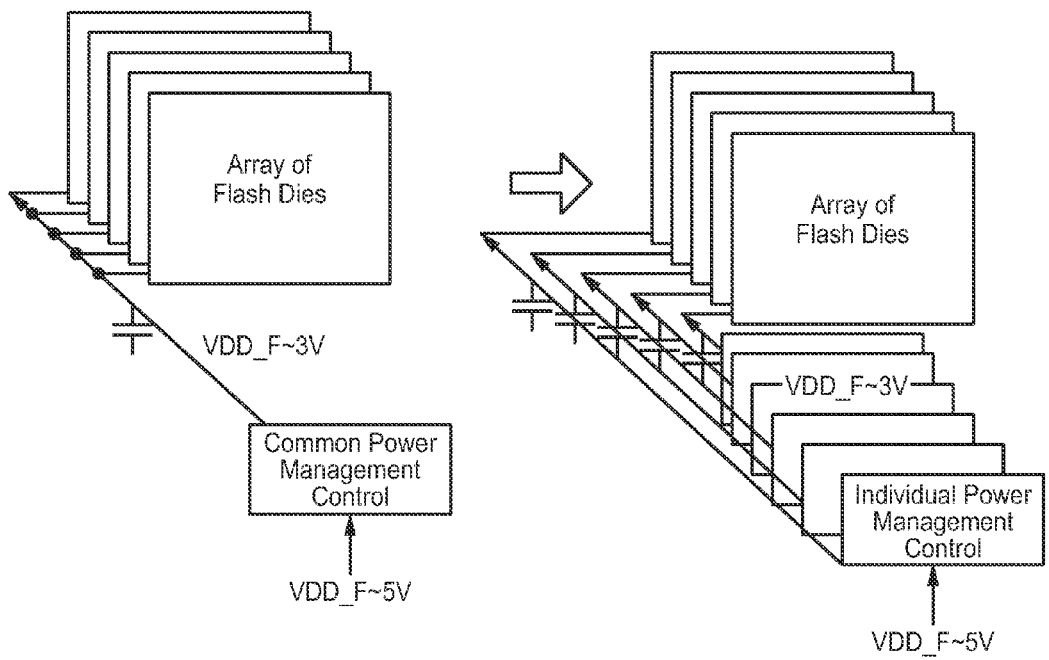
FIG. 8A  FIG. 8B

POWER MANAGEMENT FOR NONVOLATILE MEMORY ARRAY

BACKGROUND

This application relates to the operation of re-programmable non-volatile memory systems such as semiconductor flash memory, and more specifically, to systems and methods of providing power to multiple memory dies in memory arrays in such systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In addition to flash memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Various other nonvolatile memories are also in use or proposed for use in nonvolatile memory systems. Nonvolatile memories may be planar, formed along a surface of a substrate (e.g. a Silicon wafer) or may be three dimensional (3D), extending up from a surface of a substrate with memory cells formed at different levels.

Nonvolatile memory systems, such as flash memory systems are commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A memory controller is typically provided within the memory system to translate logical addresses received from the host into physical addresses within the memory array, where the data are actually stored, and then keeps track of these address translations. The memory controller may perform a variety of other functions also.

It is common for a memory system to receive a power supply from a host. For example, a USB connector includes a pin that provides power from a host to a nonvolatile memory system at 5 volts. Other interfaces similarly allow a memory system to receive electrical power from an external source such as a host. The externally supplied power may be passed to a Power Management Circuit (PMC) which manages power supplied to components of the memory system. Power may be supplied to different components at different voltages and with different current needs. The current available from a host may be limited so that if the memory system demand exceeds the current limit the supply voltage drops. A memory die may be unable to function when the voltage drops outside a specified supply voltage range. Such a drop in voltage may be detected and may be treated as a power-down, or power-off condition. It is generally desirable to manage power in a manner that avoids drops in voltage that would affect memory system operation, or would cause an unnecessary event such as a power-down.

SUMMARY OF THE INVENTION

In a memory array, distributed power management may be achieved by providing multiple power management circuits, which individually provide power to a given subset of the memory dies in the memory array. Memory dies that share a data bus and are managed by a flash interface manager may have a dedicated power management circuit so that memory dies are similarly grouped both for control purposes and for power management. Power management circuits may be operated in different modes. A power coordination circuit may determine appropriate modes for power management circuits and may provide commands accordingly. High power operations (e.g. erase, write, or high-speed read) may require a corresponding power management circuit being in a high-power mode. This may be balanced by placing one or more other power management circuits in a low-power mode.

An example of a nonvolatile memory system includes: a plurality of nonvolatile memory dies; a nonvolatile memory controller connected to the plurality of nonvolatile memory dies; and a plurality of power management circuits including at least a first power management circuit that supplies power to a first subset of the plurality of nonvolatile memory dies and a second power management circuit that supplies power to a second subset of the plurality of nonvolatile memory dies.

The first power management circuit and the second power management circuit may control currents supplied to the first subset and the second subset respectively according to current required. The currents may be supplied at a substantially constant voltage. A power coordination circuit may be in communication with the plurality of power management circuits to individually set power consumption modes for each of the plurality of power management circuits. Power consumption modes may be set according to at least one of: present or future operations, frequency of operations, number of flash memory dies per operation, and required speed of operation. The power coordination circuit may set power consumption modes to balance power consumption between power management circuits, and to maintain aggregate power consumption of the plurality of power management circuits below an upper limit. The power coordination circuit may individually set power consumption modes for each of the power management circuits so that a mode-to-mode transition of a power management circuit does not occur at the same time, or within a predetermined time from a mode-to-mode transition in another power management circuit of the plurality of power management circuits. The predetermined time may be a sufficient time to allow the power management circuit to stabilize after a mode-to-mode transition. Each of the plurality of power management circuits may be a step-down regulator that steps down a system-level supply voltage to a die-level supply voltage and maintains the die-level supply voltage within a predetermined range. The first subset of the plurality of memory dies may be connected to a memory controller by a first data bus and the second subset of the plurality of memory dies may be connected to the memory controller by a second data bus.

An example of a method of operating a nonvolatile memory system includes: receiving a system-level electrical supply from an electrical source that is external to the memory system; generating a first die-level electrical supply from the system-level electrical supply in a first power management circuit; providing the first die-level electrical supply to a first plurality of nonvolatile memory dies that are connected to a memory controller; generating a second die-level electrical supply from the system-level electrical supply in a second power management circuit; and providing the second die-level electrical supply to a second plurality of nonvolatile memory dies that are connected to the memory controller.

A first power consumption mode may be selected for the first power management circuit and a second power consumption mode may be selected for the second power management circuit. The first power consumption mode and the second power consumption mode may be selected by a central power coordination circuit that is in communication with the first power management circuit and the second power management circuit. The first power consumption mode and the second power consumption mode may be selected to maintain total power consumption below an upper limit. Power consumption modes of the first power management circuit and power consumption modes of the second power management circuit may subsequently be independently changed in response to changing current requirements. A power consumption mode may be changed from a low-power mode to a high-power mode in response to initiation of an erase operation, a write operation, or a high speed read operation. Changes from mode-to-mode in different power management circuits may be offset by at least a minimum period of time.

An example of a nonvolatile memory system includes: a plurality of nonvolatile three dimensional memory dies; a nonvolatile memory controller connected to the plurality of nonvolatile memory dies; and a plurality of power management circuits including at least a first power management circuit that supplies power to a first subset of the plurality of nonvolatile memory dies and a second power management circuit that supplies power to a second subset of the plurality of nonvolatile memory dies.

The plurality of nonvolatile three dimensional memory dies may include NAND strings that extend in a direction that is perpendicular to a principal surface of a substrate. Each of the plurality of nonvolatile three dimensional memory dies may include resistive storage elements that are connected in a direction that is perpendicular to a principal surface of a substrate.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 7 illustrates a memory system in which a controller has multiple memory interfaces, each interface connected to a bank of dies connected to a bus.

FIGS. 8A-B show two arrangements for power distribution to memory dies.

DETAILED DESCRIPTION

Memory System

Figure 1:
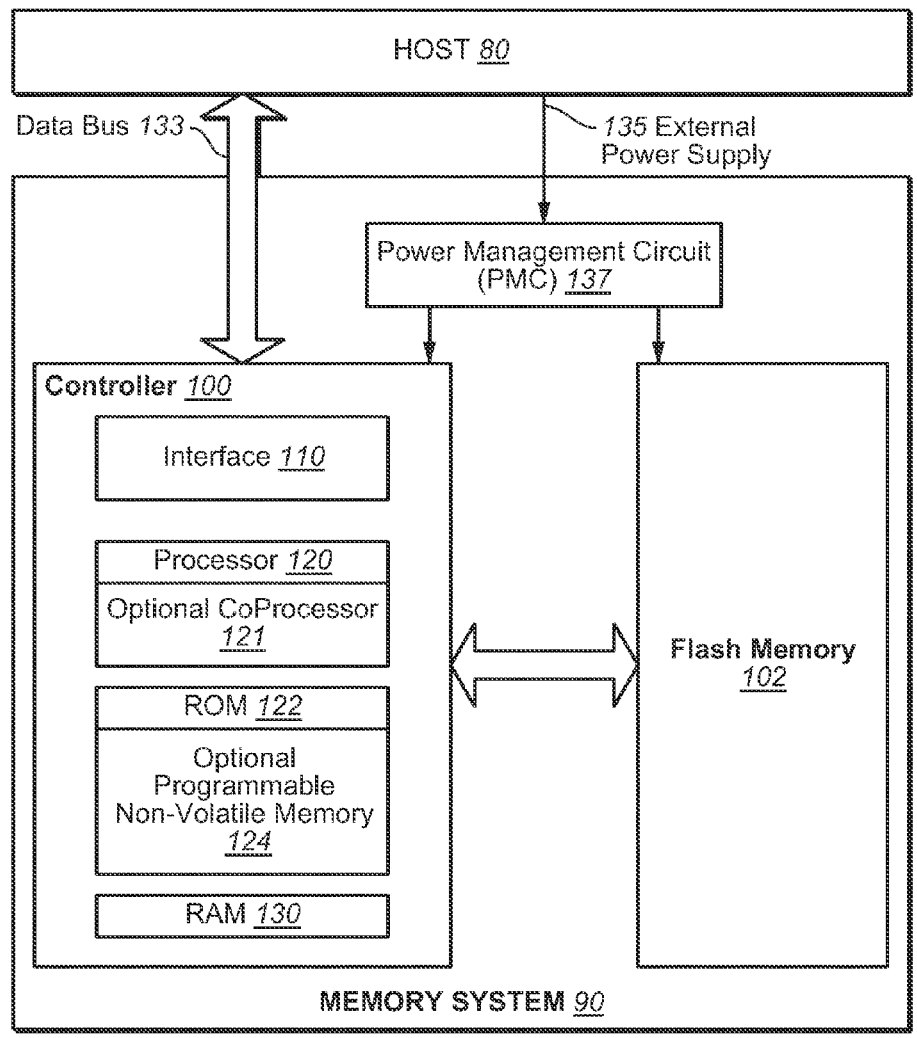
FIG. 1 illustrates schematically a prior art memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Further more, each type of memory device may have different configurations.

For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements.

One of skill in the art will recognize that this invention is not limited to the two dimensional and three dimensional exemplary structures described but cover all relevant memory structures within the spirit and scope of the invention as described herein and as understood by one of skill in the art.

FIG. 1 illustrates schematically the main hardware components of a memory system of the prior art. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chips. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

A data bus 133 extends between the host 80 and memory system 90 to allow data to be transferred to and from the memory system 90. Commands and other information may be similarly transferred between host 80 and controller 100. Power is supplied from host 80 to memory system 90 through an external power supply 135. The external power supply is received by the memory system 90 and goes to a power management circuit (PMC) 137. PMC 137 then supplies power to various components including controller 100 and flash memory 102.

Physical Memory Structure

Figure 2:
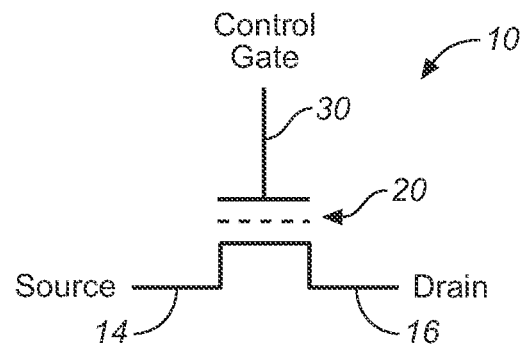
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
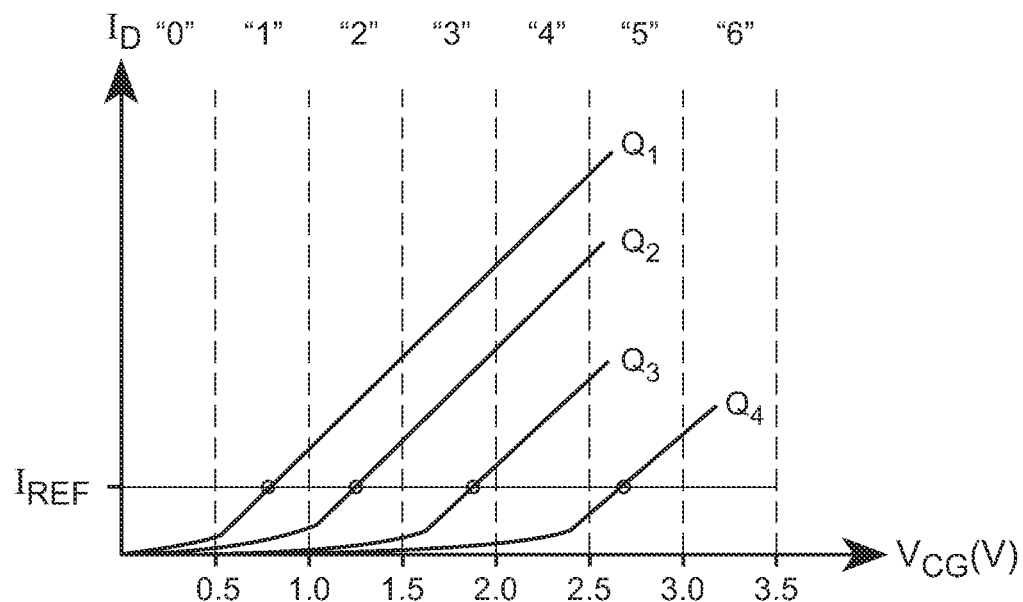
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", respectively and one erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
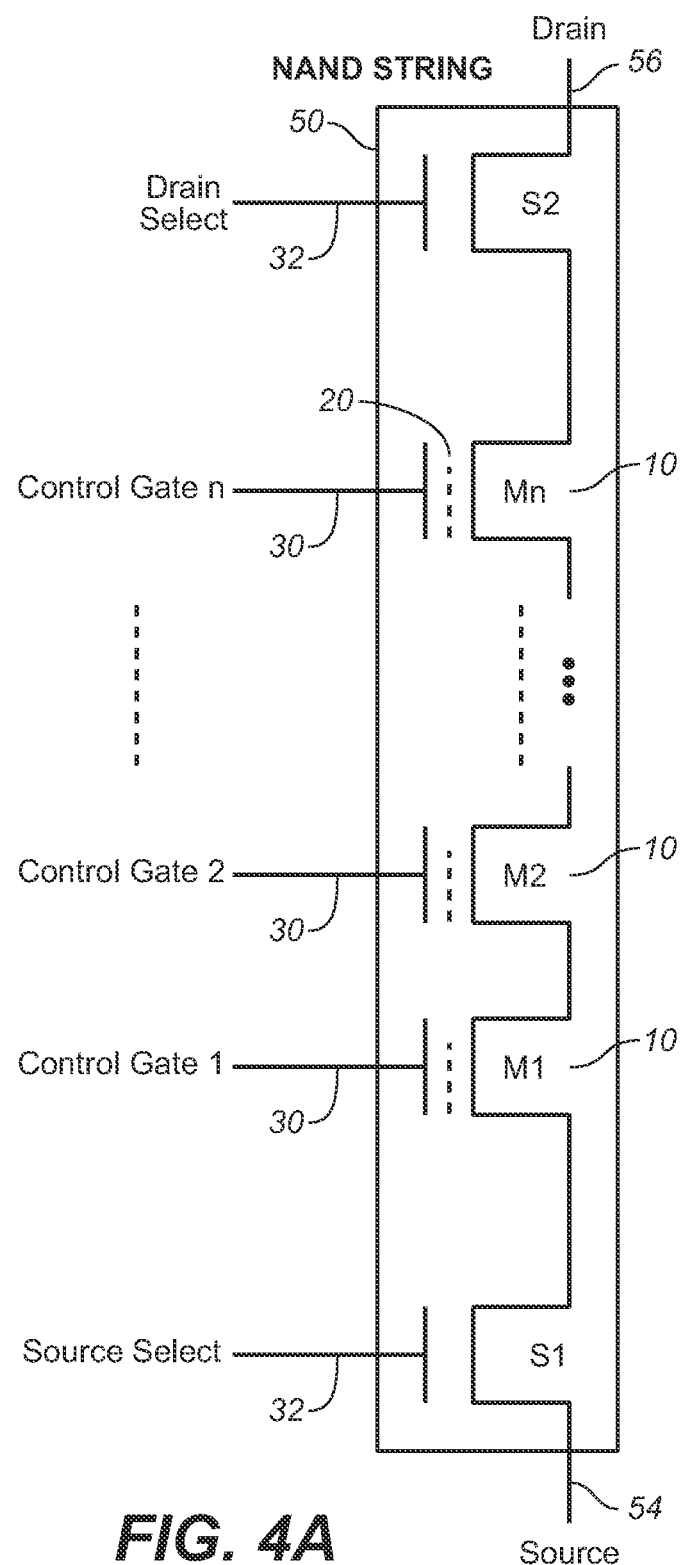
FIG. 4A illustrates schematically a string of memory cells organized into a NAND string.

FIG. 4A illustrates schematically a string of memory cells organized into a NAND string. A NAND string 50 comprises of a series of memory transistors M1, M2, Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
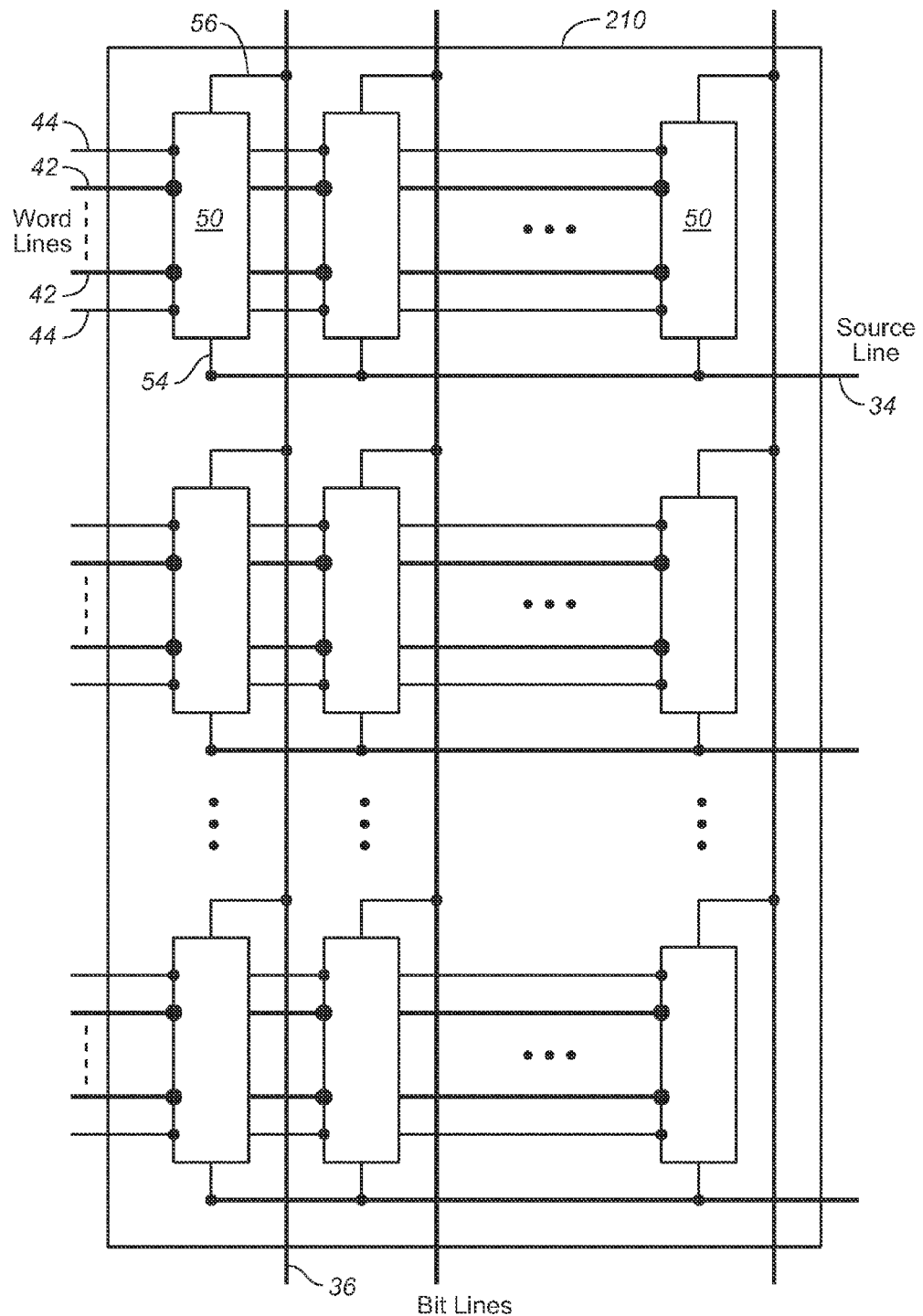
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

As can be seen from FIG. 4B, bit lines and word lines extend to serve multiple blocks in a memory array. These long lines must be driven to voltages required for read, write, and erase operations. Such long lines may have significant capacitance so that it takes some time to charge up lines that are discharged. Such charging up of lines may require significant current, at least for a short period of time when an operation is initiated. Once the lines are charged up, significant current may be required for some operations. For example, write and erase operations generally require significant current, while read operations may require substantially less current.

Figure 5:
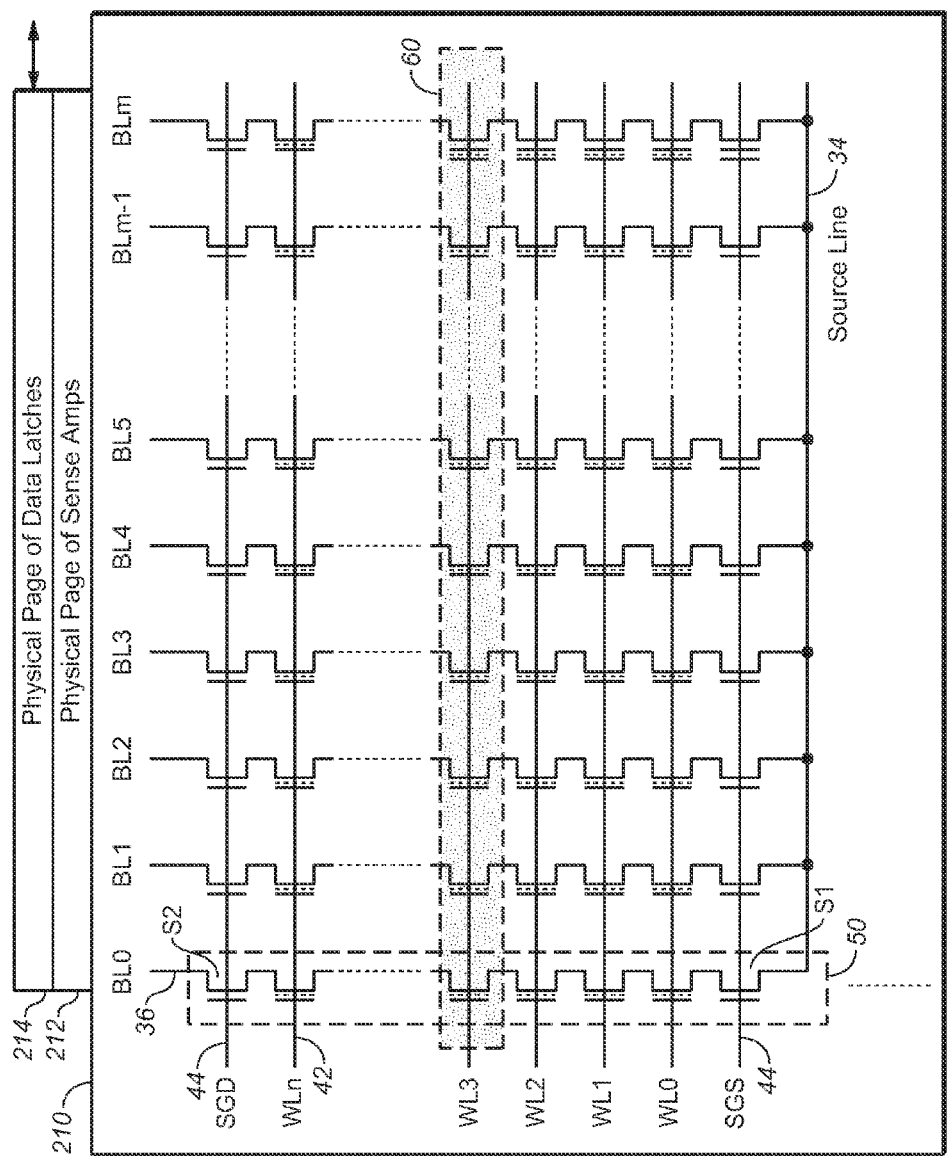
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing data and must be written to a previously unwritten location.

Furthermore erasing is to empty all the charges from the floating gate and generally takes appreciable time and significant power. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Large blocks may also require significant current for erase operations and to charge up word lines prior to erase operations.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6A:
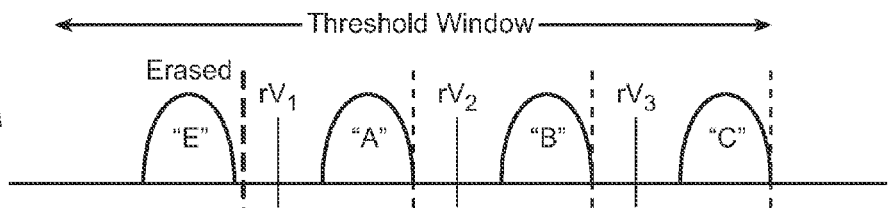
FIGS. 6A-6C illustrate an example of programming a population of 4-state memory cells.
Figure 6B:
Figure 6C:
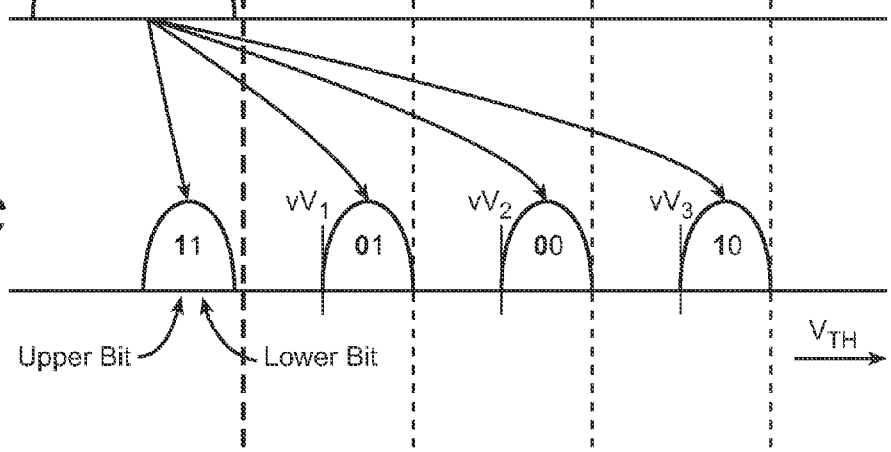

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6A illustrates the initial distribution of "erased" threshold voltages for an erased memory. FIG. 6B illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6C will become narrower and the erased state is represented by the "0" state. Programming, particularly to higher levels (e.g. B and C states) may require significant current over a significant period of time (a large number of voltage pulses). Erasing such cells may also require significant current and may require high voltages provided by charge pumps.

FIG. 7 shows a memory system 700, which includes a memory controller 702 that has four flash memory interfaces. Each interface includes a Flash Interface Manager (FIM), F1, F2, F3, F4, which manages a corresponding flash memory bus (e.g. data bus and address bus) B1-B4. Each memory bus serves a group, or bank 711-714, each having four memory dies. It will be understood that aspects of the present invention may be applied to any number of interfaces, and to busses serving any number of memory dies.

FIG. 8A shows how a common power management circuit may provide power to an array of nonvolatile memory dies (e.g. flash memory dies such as the array of FIG. 7). An externally provided voltage VDD_F is supplied at 5 volts and is stepped down for all memory dies by a common power management circuit to 3 volts. The power management circuit maintains a substantially constant output, for example, 3 volts+/−0.5 volts. Thus, the output voltage is maintained within a specified range (2.5-3.5 volts) within which memory performance is stable.

In contrast with FIG. 8A, FIG. 8B shows how a plurality of power management circuits may separately supply power to individual banks of flash memory dies. Each power management circuit serves one bank of memory dies in this arrangement. A bank of memory dies served by a power management circuit may be all the dies on a particular memory bus so that power is separately provided for memory dies connected to each FIM. In other examples, one power management circuit may supply dies corresponding to more than one FIM. While one power management circuit per FIM is a convenient arrangement, and many examples here refer to such an arrangement, aspects of the present invention may apply to various other arrangements also.

Figure 9:
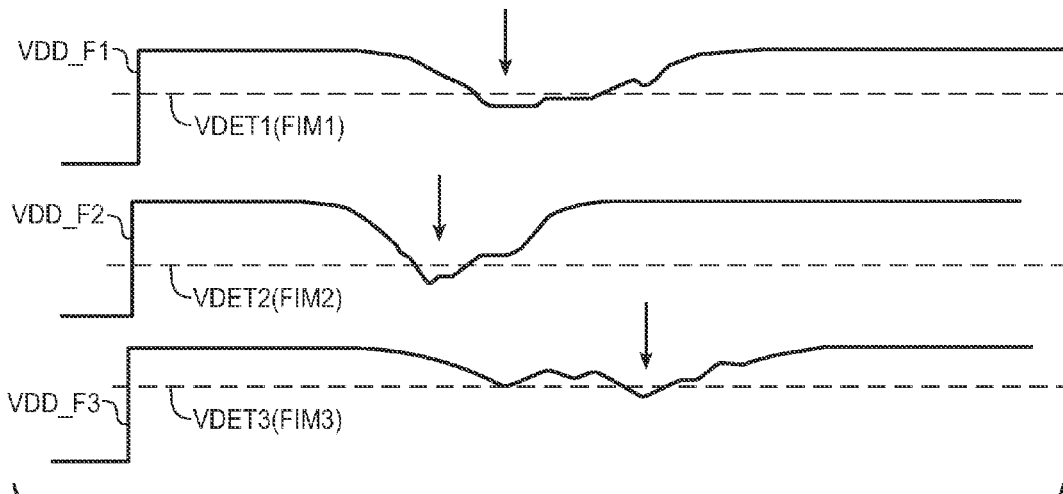
FIG. 9 shows power supply voltages provided by different power management circuits over a period of time.

FIG. 9 illustrates independent supply voltages provided to dies of different FIMs (one power management circuit per FIM). Supply voltages are indicated for each FIM, VDD_F1 for F1, VDD_F2 for F2, and VDD_F3 for F3. Supply voltages provided by the power management circuits are monitored for any drops in voltage that would affect memory die operations. When a supply voltage drops below a limit VDET, then the memory dies served by that supply voltage may stop ongoing operations and resume when the supply voltage recovers (i.e. when it returns to a level above VDET). Thus, VDD_F1 drops below VDET1(FIM1) for a short period (indicated by the arrow) and then recovers. At another time VDD_F2 drops, and at another time VDD_F3 drops. These drops occur at different times and a drop in one supply voltage generally only affects dies of a particular FIM. When VDD_F1 drops, dies of F2, F3, and F4 are unaffected. This allows the impact of heavy power use to be isolated to a small number of dies while other dies continue unaffected.

Even when changes in voltage do not reach VDET, there are advantages to having separate power management circuits. Fluctuations in power supply voltage may affect various operations, for example causing poor programming, reading, and/or erasing, which may result in a high bit error rate. By providing isolation from power fluctuations of other FIMs, power management circuits provide a cleaner voltage, which may result in better write, read, and erase operations, thus producing lower bit error rates.

Power management circuits in a memory system may be completely independent, so that they operate in parallel without regard to each other. Alternatively, some form of coordination may be provided so that an individual power management circuit modifies its operation according to some external input, for example in response to some central coordination circuit. Such a coordination circuit may provide inputs to several power management circuits and may use the inputs to configure the power management circuits for combined operation. In particular, the combined power consumption of the power management circuits may be kept below an upper limit by balancing power consumption of different power management circuits (e.g. if one power management circuit consumes a lot of power then power consumption of another power management circuit may be reduced to maintain balance).

Figure 10:
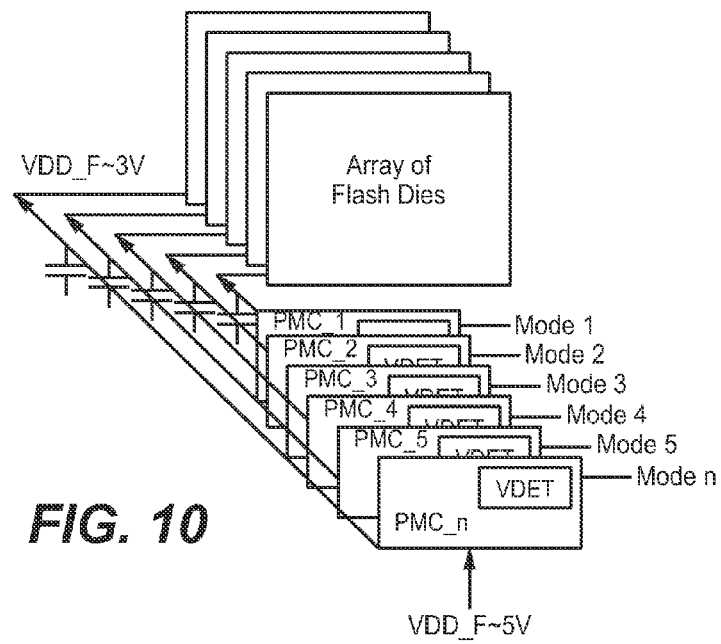
FIG. 10 shows multiple power management circuits, each having an input that determines a power management mode.

FIG. 10 illustrates an arrangement in which each power management circuit (PMC_1-PMC_n) receives an input (mode 1-mode n) that indicates a power consumption mode from a set of possible modes. In one example, power consumption modes correspond to different power consumption ranges and may correspond to low-power, mid-range power, and high-power. The number of modes, and their correspondence to particular power ranges depends on the nature and number of memory dies supplied by a power management circuit. FIG. 10 indicates modes 1-n, where n may be any suitable number. While a single input per power management circuit is shown, communication may be two-way so that power management circuits may communicate their present power consumption so that consumption of multiple such power management circuits may be coordinated.

Figure 11:
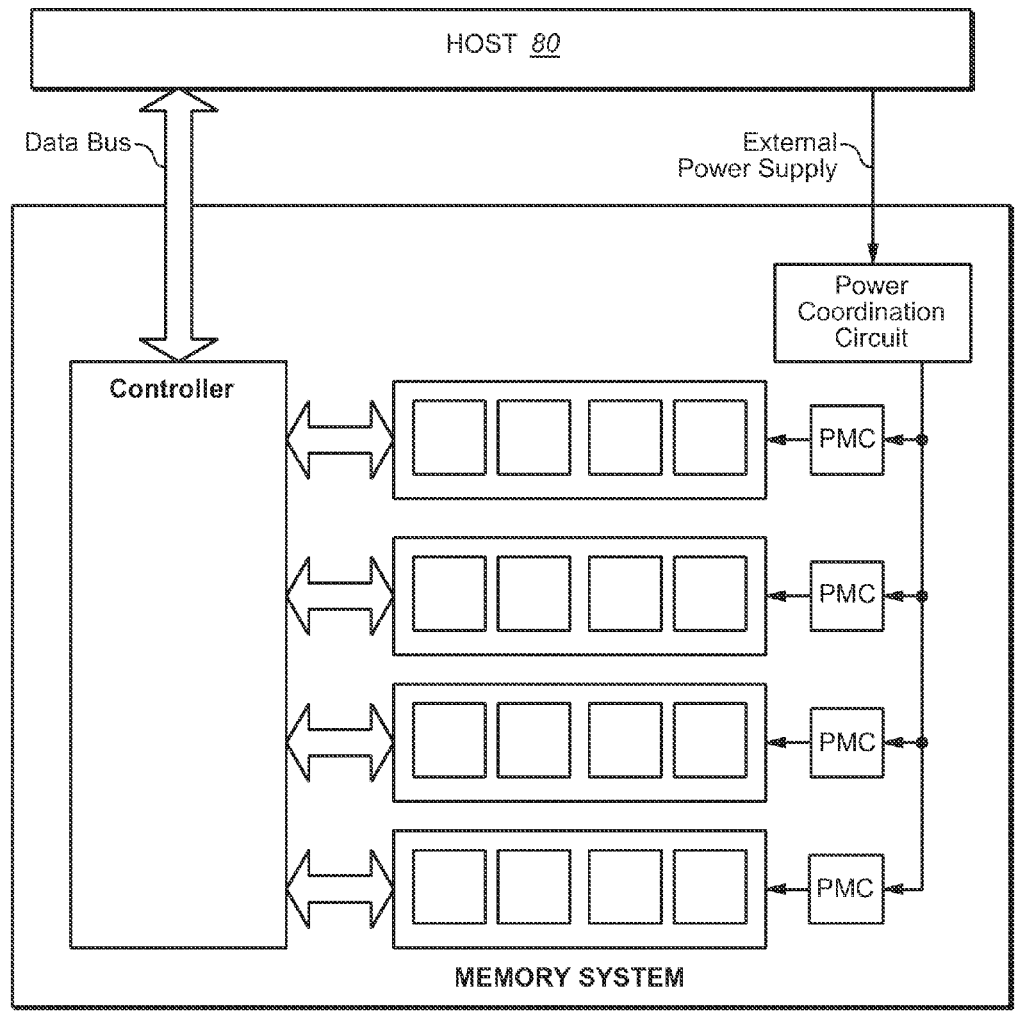
FIG. 11 shows an example of a memory system including a power coordination circuit that coordinates multiple power management circuits supplying a memory array.

FIG. 11 illustrates an implementation in which a separate power management circuit (PMC) is provided for each bank of memory dies (where a bank is a set of dies that are connected to a common FIM by a shared data bus). A power coordination circuit is in communication with the PMCs so that it can control power-consumption modes for the PMCs. The power coordination circuit receives the external power supply and may perform some initial control (e.g. stepping down or otherwise modifying the supply voltage), or may simply pass the external power supply to the individual power management circuits. Each power management circuit then maintains its output within a specified voltage range to allow operation of corresponding memory dies. The power coordination circuit may send mode commands to the individual PMCs to coordinate their power consumption. In some cases, the memory controller may send information to the power coordination circuit regarding current or future memory operations so that the power coordination circuit can adapt to changing requirements. For example, prior to an operation that consumes a lot of power (e.g. write, erase, or high speed read), the memory controller may inform the power coordination circuit that such an operation is about to start, and which FIM, or FIMS, are involved. The power coordination circuit may then modify power consumption modes of the directly affected PMCs so that they can supply the required power. The power coordination circuit may also modify power consumption modes of other PMCs to reduce their power consumption so that overall power consumption remains below an upper limit.

Figure 12A:
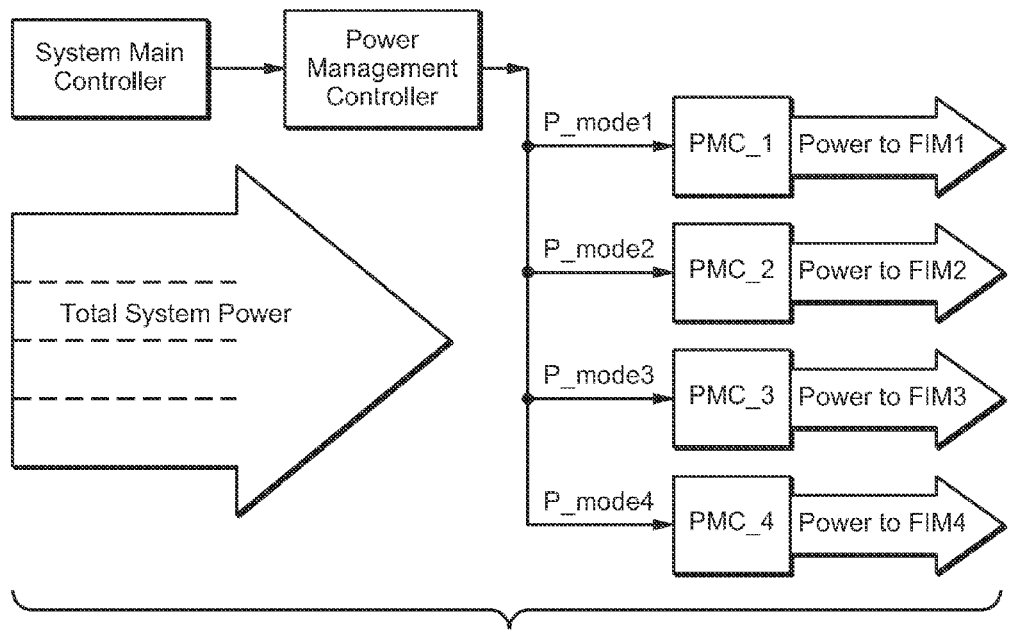
FIGS. 12A-B show examples of power distribution using multiple power management circuits.
Figure 12B:
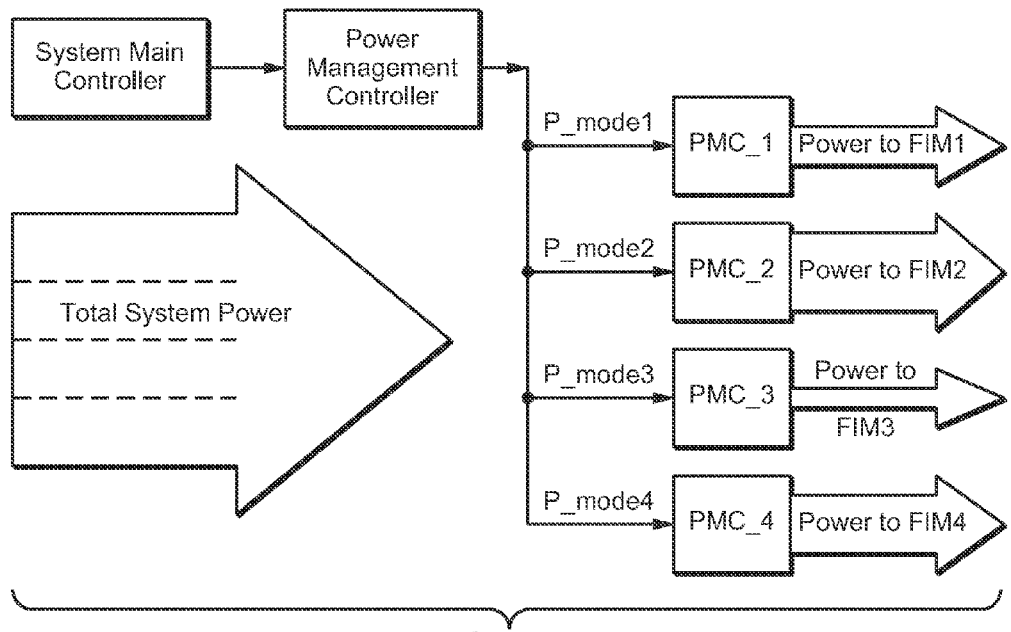

FIG. 12A shows a first example in which power is divided evenly between PMCs (each PMC's power usage is indicated by the size of the arrow extending from it to the right). In contrast, FIG. 12B shows a second example in which power is divided unevenly between PMCs with PMC_2 consuming substantially more power, and with PMC_1 and PMC_3 consuming substantially less power than average. This may be achieved by sending appropriate commands to change PMC modes, P_mode1, P_mode2, and P_mode3. This situation may arise for example where PMC_2 must supply power for a high-power operation such as an erase, a write, or a high-speed read. A high power mode is selected for PMC_2 in this situation, with low-power modes selected for PMC_1 and PMC_3 in order to maintain balance and keep overall power consumption below a predetermined limit.

Figure 13:
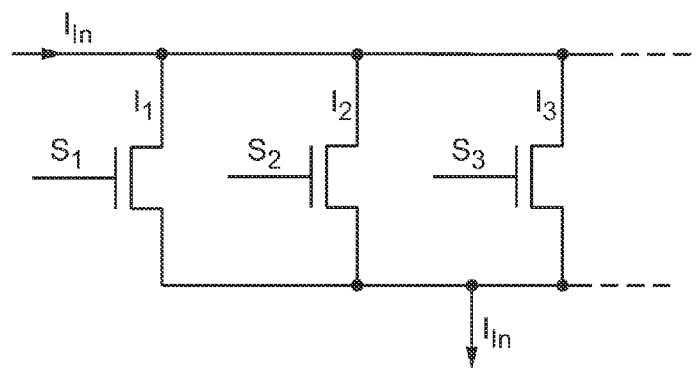
FIG. 13 illustrates an example of a portion of a power management circuit.

FIG. 13 illustrates an example of a portion of a PMC that may be used to control power consumption by adjusting the total current output. A supply current $I_{in}$ is the total current consumed by the circuit and is provided as an output to memory dies. $I_{in}$ is the sum of the currents passing through a set of transistors that are connected in parallel $I_{In}=I_1+I_2+I_3+\ldots$ (from Kirchoff's current law). Thus, by turning transistors on or off by applying appropriate gate bias (S1, S2, S3, etc.) the current consumed may be controlled. Three transistors are shown but additional transistors may be connected in parallel. According to an example, a given power mode may specify the number of transistors that are turned on in a PMC.

While a central power coordination circuit is shown in the examples above, in other cases coordination may be achieved by direct communication between power management circuits without a central coordinating circuit. In other examples, coordination may be provided by the main controller so that memory operations and the power to perform those operations are controlled by the same controller. In this way, a single controller may schedule memory operations and may configure modes of power management circuit modes to ensure that voltage supplied to any given die, or group of dies, remains within a specified range.

While many of the above examples refer to a particular form of memory (flash memory) it will be understood that aspects of the present invention are not limited to any particular form of memory and may be applied to various kinds of memory, including both 2D and 3D memory, using various data storage techniques including charge-storage and resistive techniques.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A nonvolatile memory system comprising:
   a plurality of nonvolatile three dimensional memory dies, an individual nonvolatile three dimensional memory die being monolithically formed as a plurality of physical levels of arrays of memory cells having an active area disposed above a silicon substrate;
   a memory controller connected to the plurality of nonvolatile three dimensional memory dies;
   a plurality of power management circuits including at least a first power management circuit that supplies power to a first subset of the plurality of nonvolatile three dimensional memory dies and a second power management circuit that supplies power to a second subset of the plurality of nonvolatile three dimensional memory dies; and
   a power coordination circuit in communication with the plurality of power management circuits to individually set power consumption modes for each of the plurality of power management circuits to thereby maintain aggregate power consumption of the plurality of power management circuits below an upper limit.

2. The nonvolatile memory system of claim 1 wherein the first power management circuit and the second power management circuit control currents supplied to the first subset and the second subset respectively.

3. The nonvolatile memory system of claim 2 wherein the currents are supplied at a substantially constant voltage.

4. The nonvolatile memory system of claim 1 wherein the power coordination circuit individually sets power consumption modes for each of the power management circuits so that a mode-to-mode transition of a power management circuit does not occur at the same time, or within a predetermined time from a mode-to-mode transition in another power management circuit of the plurality of power management circuits.

5. The nonvolatile memory system of claim 4 wherein the predetermined time is a sufficient time to allow the power management circuit to stabilize after a mode-to-mode transition.

6. The nonvolatile memory system of claim 1 wherein each of the plurality of power management circuits is a step-down regulator that steps down a system-level supply voltage to a die-level supply voltage and maintains the die-level supply voltage within a predetermined range.

7. The nonvolatile memory system of claim 1 wherein the first subset of the plurality of memory dies are connected to the memory controller by a first data bus and the second subset of the plurality of memory dies are connected to the memory controller by a second data bus.

8. A method of operating a nonvolatile memory system comprising:
   receiving a system-level electrical supply from an electrical source that is external to the memory system;
   generating a first die-level electrical supply from the system-level electrical supply in a first power management circuit;
   providing the first die-level electrical supply to a first plurality of nonvolatile three dimensional memory dies that are connected to a memory controller, an individual nonvolatile three dimensional memory die being monolithically formed as a plurality of physical levels of arrays of memory cells having an active area disposed above a silicon substrate;
   generating a second die-level electrical supply from the system-level electrical supply in a second power management circuit;
   providing the second die-level electrical supply to a second plurality of nonvolatile three dimensional memory dies that are connected to the memory controller; and
   selecting a first power consumption mode for the first power management circuit and selecting a second power consumption mode for the second power management circuit to maintain total power consumption of the first and second power management circuits below an upper limit.

9. The method of claim 8 wherein the first power consumption mode and the second power consumption mode are selected by a central power coordination circuit that is in communication with the first power management circuit and the second power management circuit.

10. The method of claim 8 further comprising subsequently changing power consumption modes of the first power management circuit and independently changing power consumption modes of the second power management circuit in response to changing current requirements.

11. The method of claim 10 wherein a power consumption mode is changed from a low-power mode to a high-power mode in response to initiation of an erase operation, a write operation, or a high speed read operation.

12. The method of claim 10 wherein changes from mode-to-mode in different power management circuits are offset by at least a minimum period of time.

13. A nonvolatile memory system comprising:
   a first plurality of nonvolatile three dimensional memory dies, an individual nonvolatile three dimensional memory die of the first plurality being monolithically formed in one or more physical levels of memory cells, at least one physical level having an active area disposed above a silicon substrate;
   a first power management circuit that supplies power to the first plurality of nonvolatile three dimensional memory dies;
   a second plurality of nonvolatile three dimensional memory dies, an individual nonvolatile three dimensional memory die of the second plurality being monolithically formed in one or more physical levels of memory cells, at least one physical level having an active area disposed above a silicon substrate;
   a second power management circuit that supplies power to the second plurality of nonvolatile three dimensional memory dies;
   a memory controller;
   a first data bus that connects the first plurality of nonvolatile three dimensional memory dies and the memory controller;
   a second data bus that connects the second plurality of nonvolatile three dimensional memory dies and the memory controller; and
   a central power coordination circuit that is in communication with the first power management circuit and the second power management circuit to individually select power consumption modes of the first power management circuit and the second power management circuit to maintain aggregate power consumption below a maximum consumption and to offset mode transitions of the first power management circuit and the second power management circuit by at least a minimum period of time.

14. The nonvolatile memory system of claim 13 wherein the first power management circuit and the second power management circuit are step-down regulators that steps down the system-level electrical supply voltage to die-level supply voltages and maintain the die-level supply voltages within a predetermined range.

15. The nonvolatile memory system of claim 14 wherein the minimum period of time is sufficient for a step-down regulator to stabilize after a mode transition.

16. The nonvolatile memory system of claim 13 wherein each nonvolatile three dimensional memory die of the first and second pluralities of nonvolatile three dimensional memory dies includes NAND strings that extend in a direction that is perpendicular to a principal surface of the silicon substrate.

17. The nonvolatile memory system of claim 13 wherein each nonvolatile three dimensional memory die of the first and second pluralities of nonvolatile three dimensional memory dies includes resistive storage elements that are connected in a direction that is perpendicular to a principal surface of the silicon substrate.

18. A method of operating a nonvolatile memory system comprising:
   receiving a system-level electrical supply from an electrical source that is external to the memory system;
   generating a first die-level electrical supply from the system-level electrical supply in a first power management circuit;
   providing the first die-level electrical supply to a first plurality of nonvolatile three dimensional memory dies that are connected to a memory controller by a first data bus, an individual nonvolatile three dimensional memory die of the first plurality being monolithically formed as a plurality of physical levels of arrays of memory cells having an active area disposed above a silicon substrate;
   generating a second die-level electrical supply from the system-level electrical supply in a second power management circuit;
   providing the second die-level electrical supply to a second plurality of nonvolatile three dimensional memory dies that are connected to the memory controller by a second data bus, an individual nonvolatile three dimensional memory die of the second plurality being monolithically formed as a plurality of physical levels of arrays of memory cells having an active area disposed above a silicon substrate; and
   selecting a first power consumption mode for the first power management circuit and selecting a second power consumption mode for the second power management circuit to maintain total power consumption of the first and second power management circuits below an upper limit;
   subsequently selecting a third power consumption mode for the first power management circuit and selecting a fourth power consumption mode for the second power management circuit;
   subsequently transitioning the first power management circuit from the first power consumption mode to the third power consumption mode;
   subsequently, waiting for a predetermined minimum period of time; and
   subsequently, after the predetermined minimum period of time, transitioning the second power management circuit from the second power consumption mode to the fourth power consumption mode.

19. The method of claim 18 wherein the first power consumption mode, the second power consumption mode, the third power consumption mode, and the fourth power consumption mode are selected by a central power coordination circuit that is in communication with the first power management circuit and the second power management circuit.

* * * * *